(12) United States Patent
Tamura

(10) Patent No.: US 6,649,920 B1
(45) Date of Patent: Nov. 18, 2003

(54) CELL PROJECTION USING AN ELECTRON BEAM

(75) Inventor: Takao Tamura, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/573,785

(22) Filed: May 17, 2000

(30) Foreign Application Priority Data

May 17, 1999 (JP) .......................................... 11-136081

(51) Int. Cl.[7] ........................ H01J 37/256; H01J 37/30; G03F 9/00

(52) U.S. Cl. .............................. 250/492.3; 250/492.1; 250/492.2; 250/492.22; 250/492.23

(58) Field of Search .......................... 250/492.3, 492.1, 250/492.2, 492.22, 492.23

(56) References Cited

U.S. PATENT DOCUMENTS

| | | | | |
|---|---|---|---|---|
| 5,633,507 A | * | 5/1997 | Pfeiffer et al. .............. | 250/398 |
| 6,207,962 B1 | * | 3/2001 | Okino ..................... | 250/492.1 |
| 6,307,209 B1 | * | 10/2001 | Nakasuji et al. ........ | 250/396 R |
| 6,362,489 B2 | * | 3/2002 | Okino ..................... | 250/396 R |
| 6,403,971 B1 | * | 6/2002 | Kawata .................... | 250/491.1 |
| 2001/0052578 A1 | * | 12/2001 | Okino ..................... | 250/492.3 |

FOREIGN PATENT DOCUMENTS

| | | | |
|---|---|---|---|
| JP | 05090140 A | * 4/1993 | ......... H01L/21/027 |
| JP | 6-163378 | 6/1994 | |
| JP | H9-293668 | 11/1997 | |
| JP | 11-40482 | 2/1999 | |

\* cited by examiner

*Primary Examiner*—John R. Lee
*Assistant Examiner*—Bernard Souw
(74) *Attorney, Agent, or Firm*—Scully, Scott, Murphy & Presser

(57) ABSTRACT

An electron-beam cell projection process uses a trial exposure of a test wafer by using cell apertures for use in the cell projection of the target wafer. A design difference and an actual difference between both the areas for exposure are compared against each other to obtain an offset value, which is used for the actual cell projection for correction of a stitching error caused by the projection system.

3 Claims, 7 Drawing Sheets

Lx=Xp+Xmin−Xmax
Ly=Ymax−(Yp+Ymin)

CELL PROJECTION USING AN ELECTRON BEAM

BACKGROUND OF THE INVENTION

1. Field of the Invention

The present invention relates to a cell projection technique using an electron beam and, more particularly, to forming a fine pattern on a semiconductor wafer with a high accuracy in the cell projection process.

2. Description of a Related Art

With the development of semiconductor devices typically known as Large Scale Integrated-Circuits (LSIs) finer patterning technique is rapidly advanced in the fabrication procedure of the semiconductor devices. In a lithographic process in the fabrication, an electron beam exposure technique is expected to afford finer patterning compared to the conventional optical exposure, achieving as low as 0.25 $\mu$m rule or less suited for next generation semiconductor devices.

FIG. 1 schematically shows a typical electron beam exposure system using a cell projection (block exposure) technique, together with some details of the exposure system. In the exposure system, an electron beam 50 ejected by an electron gun 101 is shaped using a first mask plate 103 having a single rectangular aperture 103A, and then patterned or further shaped by a second mask plate 106 having a plurality of rectangular apertures 106A to 106E and a single rectangular aperture 106F. The electron beam 50B passed by the second mask plate 106 generally has plural beam shapes corresponding to one of the patterns formed in the apertures 106A to 106E. The electron beam 50B is incident onto a photoresist film formed on a semiconductor wafer 11, thereby forming a fine pattern thereon.

The electron beam 50 consecutively passes a blanking electrode 102, the first aperture 103, a shaping lens 104, a shaping deflector 105, the second aperture 106, a demagnification lens 107, a main deflector 108, a sub deflector 109 and an objective lens 110 to reach the semiconductor wafer 11 mounted on a sample stage 12.

The first mask plate 103 having the aperture 103A shapes the electron beam 50 to form a rectangular electron beam 50A. The second mask plate 106 having apertures 106A to 106E, which are generally called cells or cell apertures, passes the rectangular electron beam 50A at selected one of the cell apertures 106A to 106E. Thus, as exemplified in the drawing, an electron beam 50B having a pattern shape provided by one of the apertures 106A to 106E is incident onto a photoresist film formed on the semiconductor wafer 11. The patterns on the cell apertures 106A to 106E include a contact-hole pattern and line-and-space pattern, for example, defined by design data (or Computer Assisted Design (CAD) data) for the semiconductor device.

The pattern data is generally converted into a format suited for the electron beam exposure system and then stored in a storage device 15 from outside the exposure system. A CPU 14 reads the pattern data through a bus 13 from the storage device 15, temporarily stores the same in a pattern data memory 17, and conducts processing to the pattern data such as expanding or sorting of the pattern data. The pattern data thus processed is transferred through a control unit 16 to the blanking electrode 102, shaping deflector 105, main deflector 108 and sub deflector 109, thereby irradiating the electron beam 50B or 50C having desired patterns to the desired location of the semiconductor wafer 11. The main deflector 108 and the sub deflector 109 function for shifting the image of the cell apertures with respect to the semiconductor 11. The shaping deflector 105 shifts the electron beam 50A on the mask plate 106 for aligning a selected one of the cell apertures 106A to 106E and the variably shaped beam aperture 106F to the electron beam 50B for cell projection and variably shaped beam 50C on the semiconductor wafer 11.

The second mask plate 106 has aperture 106F having a single rectangular thereon and used for a variably shaped shot which is attained by narrowing the sectional area of the electron beam 50A. Thus, an electron beam 50C having desired dimensions may be incident onto the semiconductor wafer 11 instead of the electron beam 50B having plural patterns therein, as illustrated in FIG. 1.

The cell projection technique as described above affords reduction of the number of exposure shots down to $\frac{1}{10}$ to $\frac{1}{100}$ of the number of exposure shots used in the conventional variably shaped electron-beam exposure system. Thus, the cell projection technique improves the throughput in the conventional variably shaped electron beam exposure system. In addition, the dimensions of the electron beam 50B after passing through the second mask plate 106 are stable and accurate due to the dimensions of the apertures 106A to 106E, whereby a reliable pattern having accurate dimensions can be obtained.

The electron beam 50B having a desired pattern shape therein is deflected by the main deflector 108 and the sub deflector 109 and incident onto desired location of the semiconductor wafer 11.

For a DRAM, each of the cell apertures 106A to 106E may have a basic unit pattern, which is consecutively transferred onto different locations of the semiconductor wafer 11 to define a single overall pattern in the wafer 11. In semiconductor devices, especially in the case of DRAM, if a misalignment occurs at the stitching boundary between adjacent shot areas due to a poor deflection by the deflectors 108 and 109 in the exposure system, the resulting overall pattern has a defect at the stitching boundary such as a distortion, disconnection or overlapping in the pattern. These defects may cause a functional error in the resultant semiconductor devices, and must be eliminated by using a suitable offset value for a reliable operation.

The term "offset value" as used herein means a correction amount to be applied for correcting the deviation at the stitching boundary between adjacent shot areas. In fact, if the adjacent areas are exposed by using the CAD data as it is, a variety of factors cause deviations at the stitching boundary between the shot areas in the resultant pattern.

Patent Publication JP-A-11-40482 proposes for solving the above problem, wherein a basic unit pattern in the CAD data is modified so that a single exposure shot does not include divided patterns which are included in a single-piece pattern. This is achieved by shifting the exposure area in the mask plate to include the whole single-figure pattern in the exposure area while maintaining the size of the exposure area.

The proposed technique may be effective to eliminate deviation at the stitching boundary so long as the single-piece pattern is concerned. However, this technique does not afford elimination of the deviation between the exposed area and the non-exposed area. Conventional techniques for solving such a deviation problem include one using a mask plate 106, such as shown in FIG. 2, including adjustment apertures 106G to 106K each, having an adjustment pattern thereon used for correction of the shot location using a corresponding one of the cell apertures 106A to 106E. The pattern includes a first adjustment section for Y-direction and a second adjustment section for X-direction. FIG. 3 shows an exposure process using the mask plate 106 of FIG. 2. In the exposure process, the mask plate 106 is first mechanically shifted to the area of the adjustment apertures 106G to 106K (step S), followed by a trial exposure through the adjustment apertures 106G to 106K to a test wafer (step S2) by using a cell projection technique and a variably shaped technique 106F. FIG. 4 shows the result of the trial exposure, wherein master scales 21 (hatched portions) are formed by the cell projection shot and the vernier scales 22 (stained portions) are formed by the variably shaped 106F shot. The offset value (Sx, Sy) is then calculated based on the dimensions of the vernier scales 22 with respect to the master scales 21 (step S3). The mask plate 106 is then mechanically shifted to the area of the cell apertures 106A to 106E (step S4), followed by electron beam exposure of the semiconductor wafer based on the CAD data while as applying a correction based on the offset value (Sx, Sy) for canceling the deviation (step S5).

In the conventional technique as described above, the offset value obtained by the trial exposure through the adjustment aperture in fact deviates from the optimum offset value to be used in the cell projection through the cell apertures, due to an error caused by the mechanical shift of the mask plate 106 between the adjustment apertures 106G to 106K and the cell apertures 106A to 106F.

Patent Publication JP-A-6-163378 describes a technique, such as shown in FIG. 5, wherein one of the cell apertures is aligned to the electron beam by mechanical shifting a mask plate (step S6), followed by a cell projection shot of a reference mark on the stage (step S7) through the selected cell aperture. By processing the signal obtained from the electron beam reflected at the reference mark, an offset value (Sx, Sy) for the cell projection is calculated (step S8), which is then used for the actual cell projection to the semiconductor wafer (step S9).

In the technique described in the publication, however, the reference mark does not always afford an optimum offset value, because detected waveform of reflected electrons is often deformed due to contamination or abrasion of the reference mark, which makes a location of the reference mark erroneous. As a result, an optimum offset value cannot be obtained.

SUMMARY OF THE INVENTION

In view of the above, it is an object of the present invention to provide a method for use in a cell projection process, which is capable of determining an optimum offset value for correcting stitching error at the stitching boundary between adjacent shot areas.

The present invention provides a method for aligning a beam passing through a cell aperture with a designed location in a cell projection process, comprising the steps of selecting from design data first and second pattern data for cell projection of first and second shot areas, respectively, calculating a coordinate difference between coordinates of the first area and coordinates of the second area, passing a beam through a first cell aperture having the first pattern data to obtain a first shot area, passing a beam through a second aperture having the second pattern data by using the coordinate difference to obtain a second shot area so that the second shot area is located at a design difference with respect to the first shot area, calculating an offset value based on a difference between the design difference and an actual difference, conducting a plurality of cell projections using at least the first cell aperture and the second cell aperture to a semiconductor wafer based on the design data and the offset value.

In accordance with the method of the present invention, the offset value can be obtained from the same cell apertures used for actual cell projection, whereby the costs for the mask plate having no adjustment pattern thereon can be reduced. In addition, since the mask plate is not mechanically shifted between the trial exposure and the actual cell exposure, an error caused by the mechanical shift as encountered in the conventional process can be eliminated. Thus, the accuracy in the cell projection can be improved.

PREFERRED EMBODIMENTS OF THE INVENTION

Figure 1:
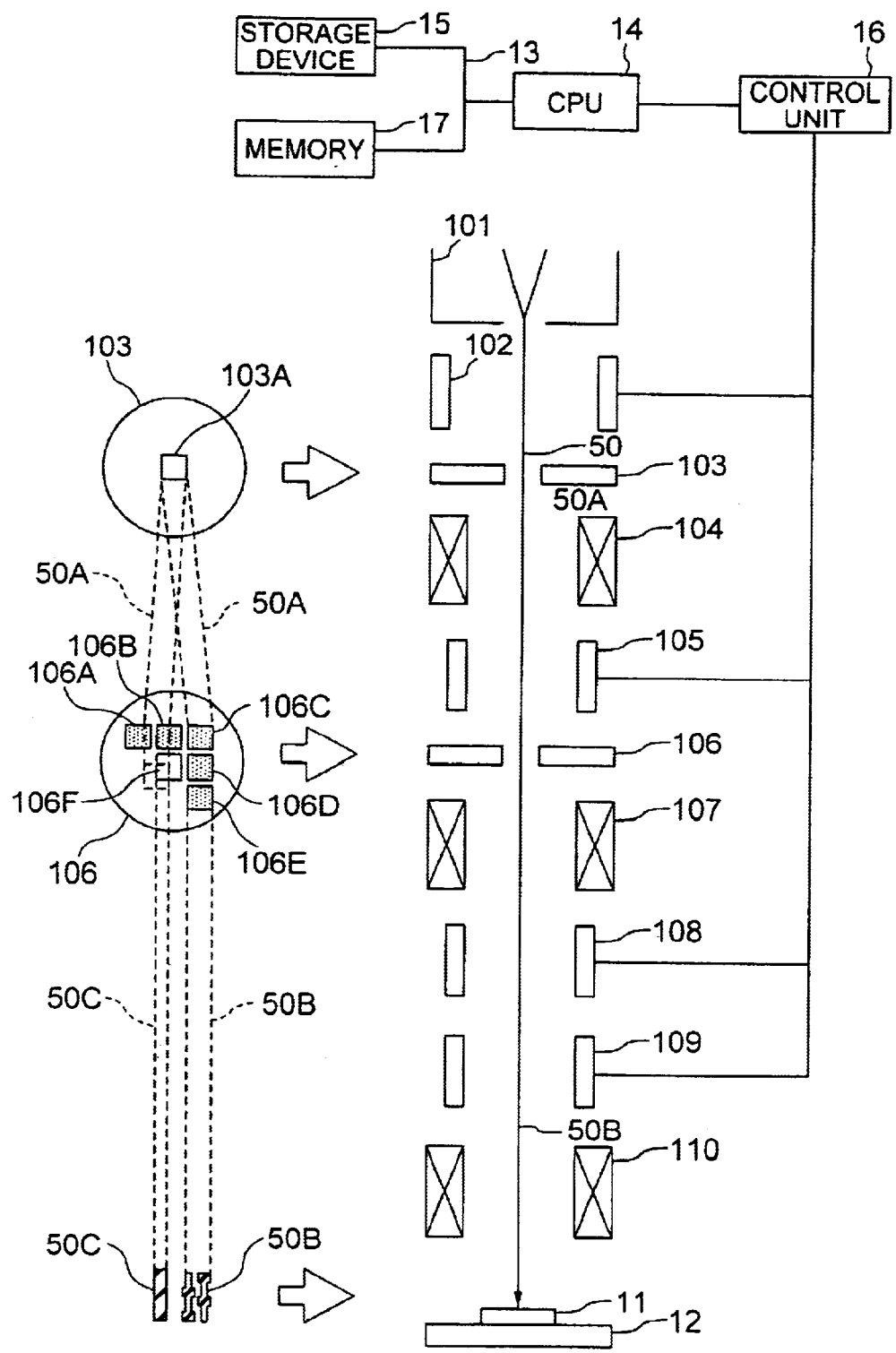
FIG. 1 is a schematic diagram of a typical electron beam exposure system.
Figure 2:
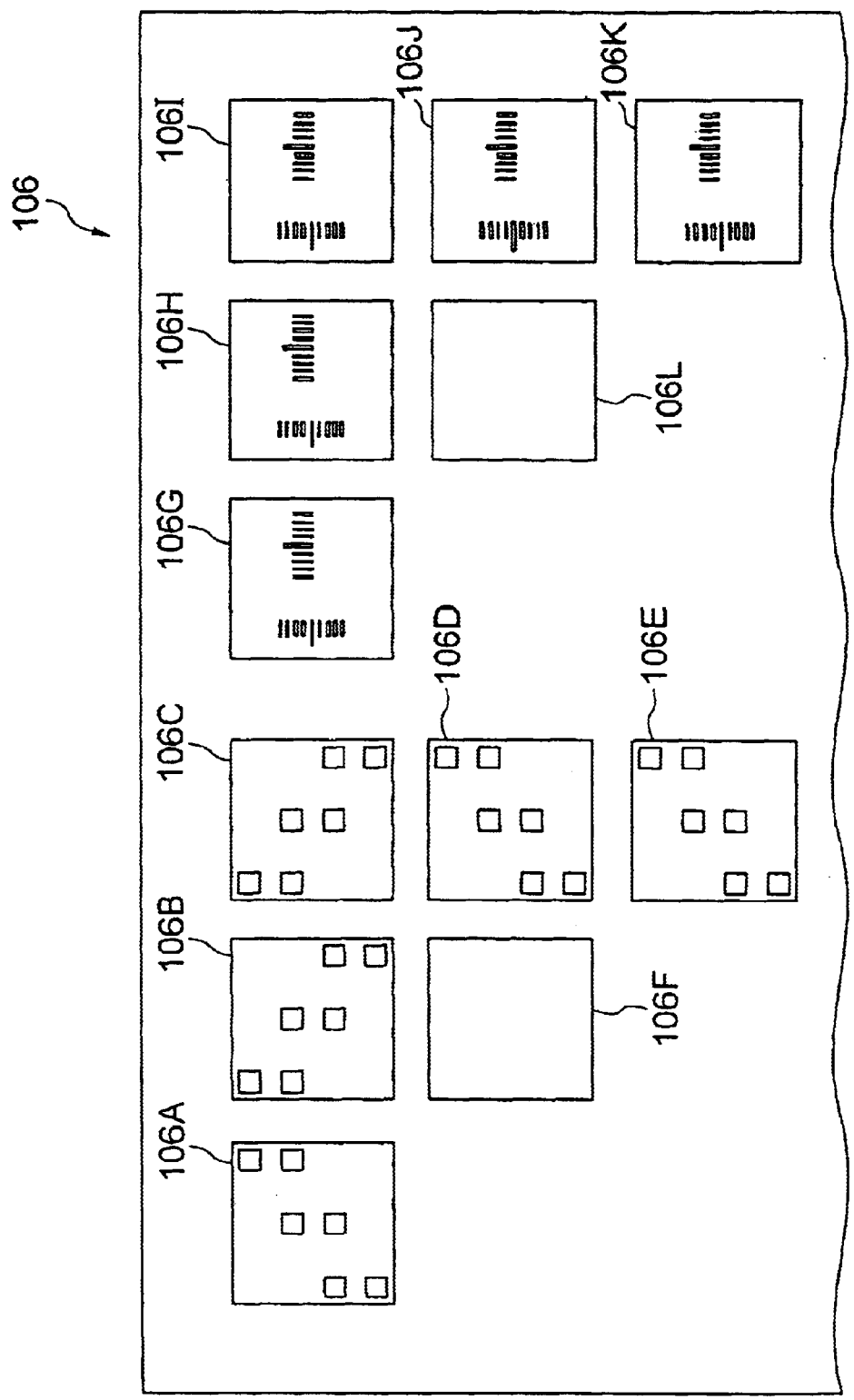
FIG. 2 is a top plan view of an exemplified mask plate for use in the electron beam exposure system of FIG. 1.
Figure 3:
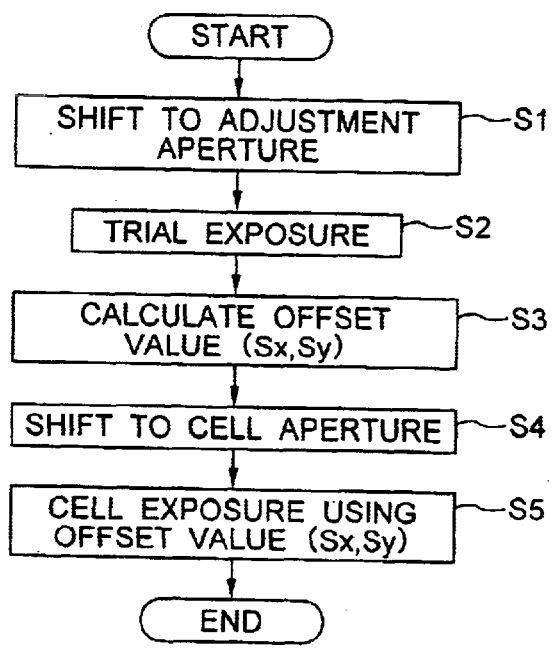
FIG. 3 is a flowchart of a conventional technique for determining an offset value at a stitching boundary between shots.
Figure 4:
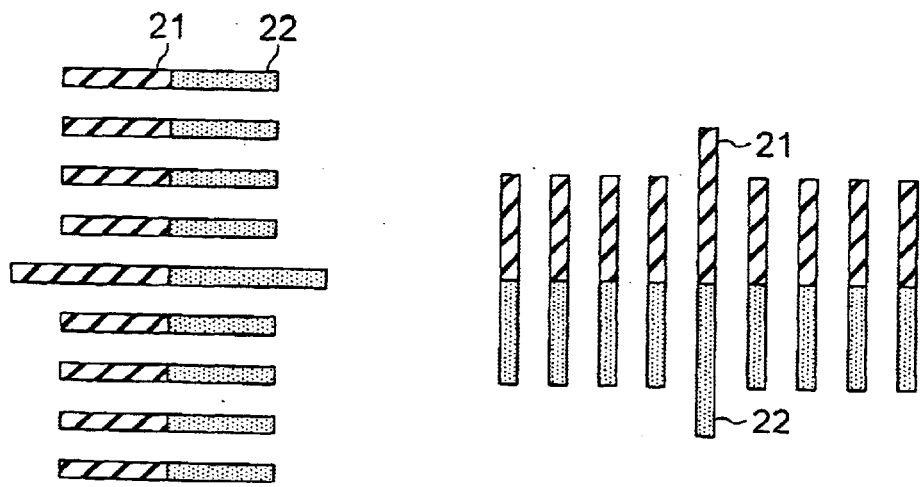
FIG. 4 is a pattern formed on a test sample for evaluation of the offset value by the process shown in FIG. 3.
Figure 5:
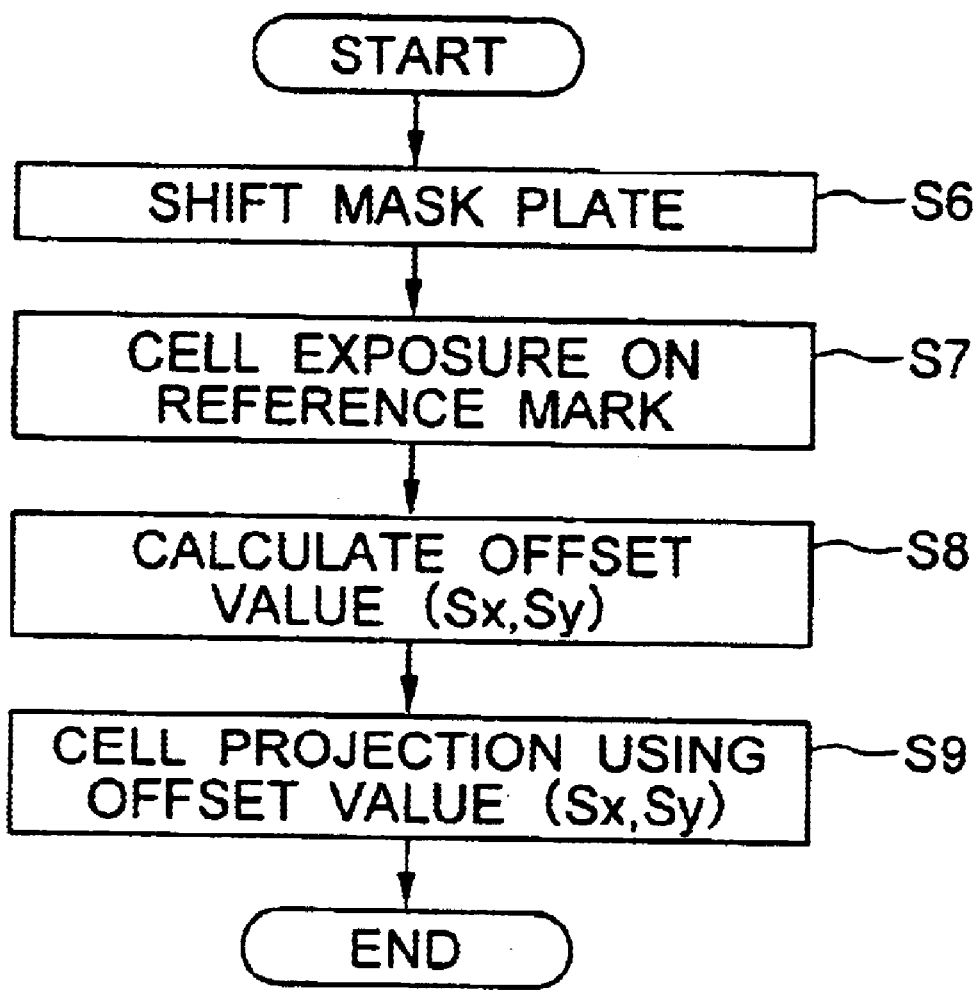
FIG. 5 is a flowchart of an another conventional cell projection process for determining an offset value.

Now, the present invention is more specifically described with reference to accompanying drawings, wherein similar constituent elements are designated by similar reference numerals throughout the drawings.

Figure 6:
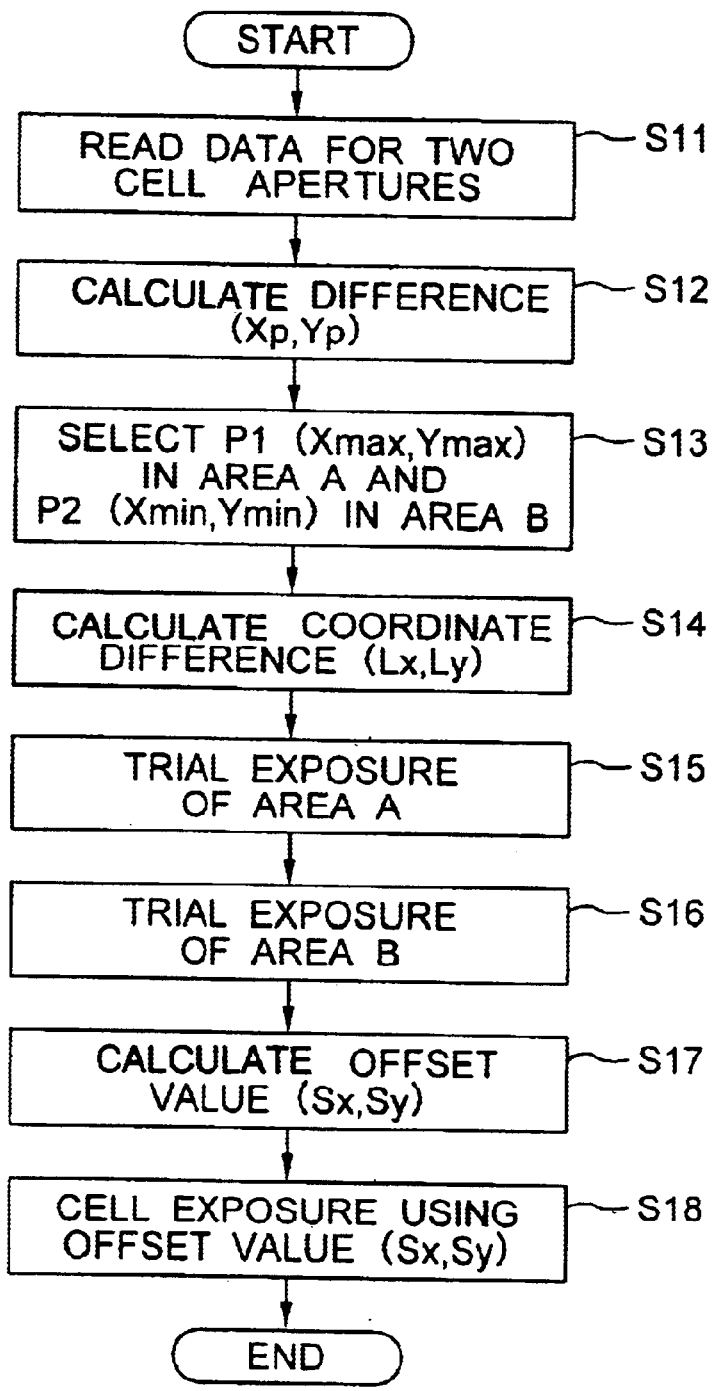
FIG. 6 is a flowchart of a cell projection process according to an embodiment of the present invention.

Referring to FIG. 6, an electron beam exposure process according to an embodiment of the present invention is used in the electron beam exposure system shown in FIG. 1.

Figure 7A:
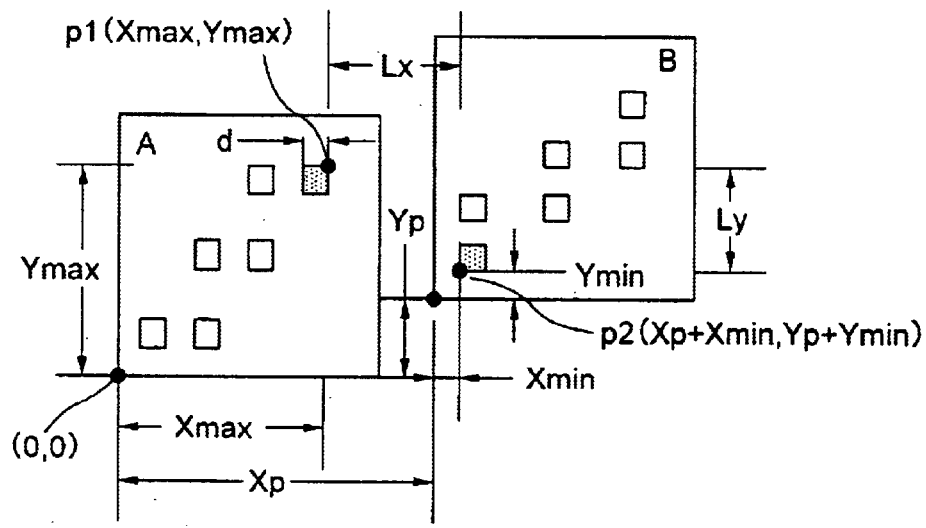
FIGS. 7A and 7B are explanatory diagram for showing determination of an offset value.

In the first step S11, the data for selected two of the cell apertures (first cell aperture and second cell aperture) having similar figures, such as contact holes, are read from the CAD data stored in the storage device 15. The CAD data is indicating that these apertures are used for respective beam shots in respective areas. Then, the differences (Xp, Yp) between the coordinates of the original point of the first cell aperture (A) and the original point of the second cell aperture (B) are calculated, as shown in FIG. 7A.

From the data of the first cell aperture, a pattern figure P1 having the uppermost coordinates in the first cell aperture is selected, and the uppermost coordinates p1 (Xmax, Ymax) of the selected figure P1 are extracted. On the other hand, from the data of the second cell aperture, a patern figure P2 having the lowermost coordinates in the second cell aperture is selected, and the lowermost coordinates p2 (Xp+Xmin, Yp+Ymin) of the selected figure P2 are extracted.

Subsequently, the design difference (Lx, Ly) between coordinates p1 and coordinates p2 are calculated wherein Lx=Xp+Xmin−Xmax and Ly=Ymax−(Yp+Ymin). A first trial exposure is conducted to a test wafer by using the first cell aperture at the design location, followed by a second trial shot to the test wafer at a location shifted by (−Lx−d, −Ly) from the design location, wherein "d" is the dimension of the contact hole as shown in FIG. 7A.

Figure 7B:
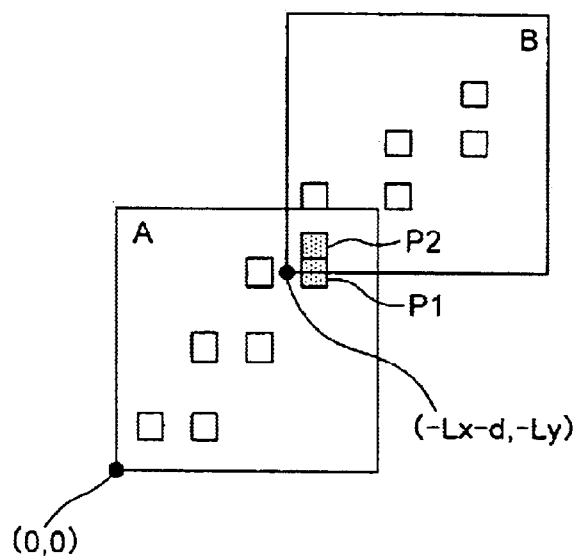

After the above exposure of two shots, as shown in FIG. 7B, the ideal pattern, without any stitching deviations involved in the two shots, includes pattern figures P1 and P2 which are disposed in contact with each other without a gap or overlapping in Y-direction while aligned with each other in X-direction. If there is any stitching deviation observed from the ideal pattern, the stitching deviation is measured to obtain an offset value (Sx, Sy).

The cell exposure for target semiconductor wafers are then conducted for all the wafer area based on the CAD data and the offset value (Sx, Sy) as obtained above. As a result, any stitching deviation is substantially eliminated between shot areas.

Referring to FIGS. 8A to 8F, there are shown exemplified patterns obtained by trial shots used in an electron beam exposure process according to a second embodiment of the present invention. The process itself is similar to the first embodiment and is not specifically described here.

In the second embodiment, the steps of trial shots are different from that of the first embodiment. More specifically, the present embodiment includes a first trial shot similar to the first embodiment of the present invention, whereas the second trial shot is conducted for a plurality of times involving different shifts in X- and Y-directions from the original location in the first embodiment.

Figure 8C:
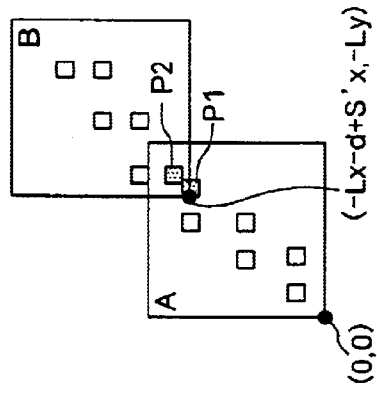
FIGS. 8A to 8F are results of trial exposure for determining the offset value.
Figure 8F:
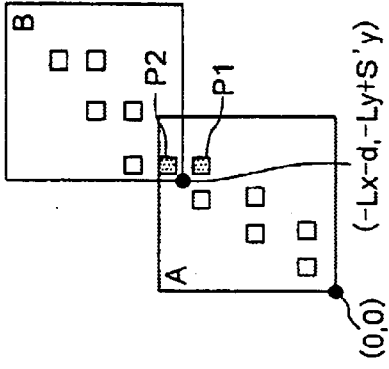
Figure 8B:
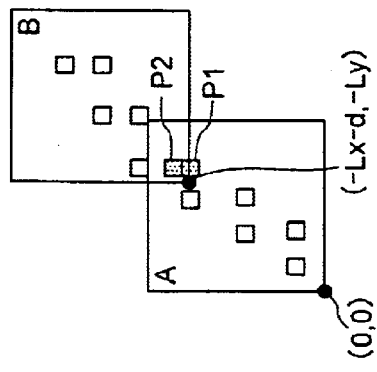
Figure 8E:
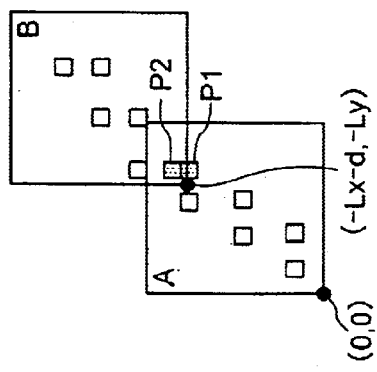
Figure 8A:
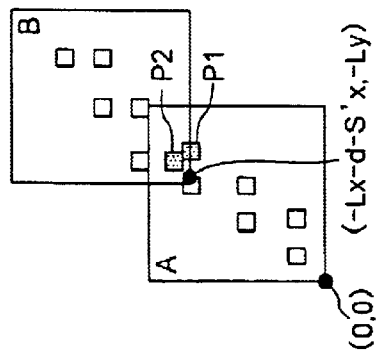
Figure 8D:
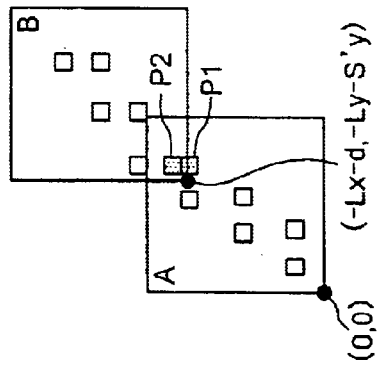

The second shots shown in FIGS. 8A, 8B and 8C are conducted by changing additional shifts S'x for the coordinates (−Lx−d+S'x, −Ly) used for the second shots while fixing the Y-coordinate for the second shots. The second shot is finished if the figures P1 and P2 are aligned in the X-direction, or have least stitching deviation. The amount of the additional shit S'x achieving the alignment or least stitching deviation is stored as an offset value for the X-coordinate. Subsequently, the second shots shown in FIGS. 8D, 8E and 8F are conducted by changing additional shits S'y for the coordinates (−Lx−d, −Ly+S'y) used for the second shots. The second shot is finished if a contact is achieved between the figures P1 and P2 without any overlapping or gap, or with least overlapping or gap. The amount of the additional shift S'y achieving the contact is stored as an offset value for the Y-coordinate. The offset value (S'x, S'y) is then used for cell projection of the target semiconductor wafer 11.

In the second embodiment, since the offset value is determined by observing the alignment or contact itself between the figures P1 and P2 on the test wafer, the resultant offset value has a higher accuracy compared to the first embodiment.

Since the above embodiments are described only for examples, the present invention is not limited to the above embodiments and various modifications or alterations can be easily made therefrom by those skilled in the art without departing from the scope of the present invention.

What is claimed is:

1. A method for aligning a beam passing through a cell aperture with a designed location in a cell projection process, comprising the steps of selecting from design data first and second pattern for cell projection of first and second shot areas, respectively, calculating a coordinate difference between coordinates of said first pattern and coordinates of said second pattern, passing a beam through a first cell aperture having said first pattern to obtain a first shot area, then passing a beam through a second cell aperture having said second pattern by using said coordinate difference to obtain a second shot area so that said second shot area is located at a design difference with respect to said first shot area, calculating an offset value based on a difference between said design difference and an actual difference measure between the two patterns exposed on a semiconductor wafer, conducting a plurality of cell projections using at least said first cell aperture and said second cell aperture on said semiconductor wafer based on said design data and said offset value.

2. The method as defined in claim 1, wherein said design difference is calculated based on a first pattern figure in said first cell aperture and a second pattern figure in said second cell aperture.

3. The method as defined in claim 1, wherein said beam is an electron beam.

* * * * *